(12) United States Patent
Park et al.

(10) Patent No.: US 12,400,912 B2
(45) Date of Patent: Aug. 26, 2025

(54) DUAL-DAMASCENE FAV INTERCONNECTS WITH DIELECTRIC PLUG

(71) Applicant: International Business Machines Corporation, Armonk, NY (US)

(72) Inventors: Chanro Park, Clifton Park, NY (US); Kenneth Chun Kuen Cheng, Shatin (HK); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 468 days.

(21) Appl. No.: 17/457,238

(22) Filed: Dec. 1, 2021

(65) Prior Publication Data
US 2023/0170253 A1  Jun. 1, 2023

(51) Int. Cl.
| H01L 21/768 | (2006.01) |
| H01L 23/522 | (2006.01) |
| H01L 23/528 | (2006.01) |
| H01L 23/532 | (2006.01) |

(52) U.S. Cl.
CPC .. *H01L 21/76831* (2013.01); *H01L 21/76807* (2013.01); *H01L 21/7684* (2013.01); *H01L 21/76843* (2013.01); *H01L 21/76879* (2013.01); *H01L 21/76897* (2013.01); *H01L 23/5226* (2013.01); *H01L 23/528* (2013.01); *H01L 23/53238* (2013.01); *H01L 23/53295* (2013.01)

(58) Field of Classification Search
CPC ............. H01L 21/76807; H01L 23/528; H01L 21/76831; H01L 21/76843; H01L 23/5226; H01L 23/53295; H01L 21/76849; H01L 21/76883; H01L 21/76834
See application file for complete search history.

(56) References Cited

U.S. PATENT DOCUMENTS

| 9,324,650 | B2 | 4/2016 | Edelstein |
| 9,806,023 | B1 | 10/2017 | Briggs |
| 9,953,865 | B1 | 4/2018 | Briggs |
| 10,177,028 | B1 | 1/2019 | Licausi |
| 10,276,436 | B2 | 4/2019 | Briggs |
| 10,297,467 | B2 | 5/2019 | Wallace |
| 10,366,903 | B2 | 7/2019 | Lin |

(Continued)

OTHER PUBLICATIONS

Briggs et al., "Fully Aligned via Integration for Extendibility of Interconnects to Beyond the 7 nm Node," International Electron Devices Meeting (IEDM), 2017, pp. 1-4.

*Primary Examiner* — Thanhha S Pham
(74) *Attorney, Agent, or Firm* — Aaron N. Pontikos (57) ABSTRACT

The structure comprises a first low-k dielectric layer on top of a substrate. The structure comprises one or more trenches within the first low-k dielectric layer. The structure comprises a first barrier layer on the first low-k dielectric layer, a first liner layer on top of the first barrier layer and a first metal layer on top of the first liner layer, wherein a top of the first barrier layer, the first liner layer, and the first metal layer are at least 5 nm below a top of the first low-k dielectric layer. The structure comprises a dielectric cap between portions the first low-k dielectric layer and a second low-k dielectric layer. The structure comprises a dielectric plug between portions of the first low-k dielectric layer and the second low-dielectric layer.

13 Claims, 10 Drawing Sheets

(56) References Cited

U.S. PATENT DOCUMENTS

| | | |
|---|---|---|
| 10,366,919 B2 | 7/2019 | Licausi |
| 10,395,986 B1 | 8/2019 | Briggs |
| 2019/0019726 A1 | 1/2019 | Ryan |
| 2019/0252208 A1 | 8/2019 | Wallace |
| 2021/0335659 A1* | 10/2021 | Motoyama ........ H01L 21/76841 |
| 2021/0391275 A1* | 12/2021 | Kuo .................. H01L 23/53238 |

* cited by examiner

DUAL-DAMASCENE FAV INTERCONNECTS WITH DIELECTRIC PLUG

BACKGROUND OF THE INVENTION

The present invention relates generally to the field of semiconductor device manufacture and more particularly to dual-damascene fully-aligned via (FAV) interconnects with dielectric plugs.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

SUMMARY

Embodiments of the present invention provide for a method of forming a dual-damascene fully-aligned via. In an embodiment, a first low-k dielectric layer is deposited on top of a substrate. One or more trenches are patterned within the first low-k dielectric layer. A first barrier layer is deposited on the first low-k dielectric layer. A first liner layer is deposited don the first barrier layer. A first metal layer is deposited on the first liner layer. The first low-k dielectric layer, the first barrier layer, the first liner layer, and the first metal layer are planarized to all have a same height. The first barrier layer, the first liner layer and the first metal layer are etched so a top of the first barrier layer, the first liner layer, and the first metal layer are at least 5 nm below a top of the first low-k dielectric layer. A dielectric cap is deposited on the first low-k dielectric layer, the first barrier layer, the first liner layer and the first metal layer. A second low-k dielectric layer is deposited on the dielectric cap. The second low-k dielectric layer is dual damascene patterned to form two or more trenches to expose portions of the dielectric cap. The dielectric cap is etched to remove exposed portions of the dielectric cap. A dielectric plug layer is deposited on the second low-k dielectric layer, the first low-k dielectric layer, the first barrier layer, the first liner layer, and the first metal layer. The dielectric plug layer is etched to remove portions of the dielectric plug layer.

Embodiments of the present invention provide for a dual-damascene fully-aligned via structure. In an embodiment, the structure comprises a laterally recessed region between a first low-k dielectric layer and a second low-k dielectric layer in either lateral direction within each trench of two or more trenches. In an embodiment, the structure comprises a dielectric plug within each laterally recessed region within each trench of the two or more trenches Embodiments of the present invention provide for a dual-damascene fully-aligned via structure. In an embodiment, the structure comprises a first low-k dielectric layer on top of a substrate. In an embodiment, the structure comprises one or more trenches within the first low-k dielectric layer. In an embodiment, the structure comprises a first barrier layer on the first low-k dielectric layer, a first liner layer on top of the first barrier layer and a first metal layer on top of the first liner layer, wherein a top of the first barrier layer, the first liner layer, and the first metal layer are at least 5 nm below a top of the first low-k dielectric layer. In an embodiment, the structure comprises a dielectric cap between portions the first low-k dielectric layer and a second low-k dielectric layer. In an embodiment, the structure comprises a dielectric plug between portions of the first low-k dielectric layer and the second low-dielectric layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that dual-damascene fully-aligned via (FAV) interconnects require a thick enough etch stop layer to achieve a desirable FAV structure. Embodiments of the present invention recognize that it is preferred top open the etch stop layer using a wet etching process because when a dry etch can cause the damage the interlayer dielectrics. Embodiments of the present invention recognize that current wet etching approaches can generate an undesired undercut. Embodiments of the present invention recognize that undercut regions cause by wet etching processes can be filled by the metallic barrier/liner during the metal fill process that can cause potential leakage/short issues.

Embodiments of the present invention provide for a dielectric conformal deposition and wet etch process approach prior to metallization to fill and plug the undercut regions created by the wet etch. Embodiments of the present invention provide for preventing metals from filling the undercut regions caused by wet etch. Embodiments of the present invention provide for a dielectric plug that prevents the metallic barrier/liner from depositing into the lateral recessed portion caused by the etching process.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-13 depict a structure and method of forming dual-damascene fully-aligned via (FAV) interconnects with dielectric plugs in accordance with an embodiment of the invention.

Figure 1:
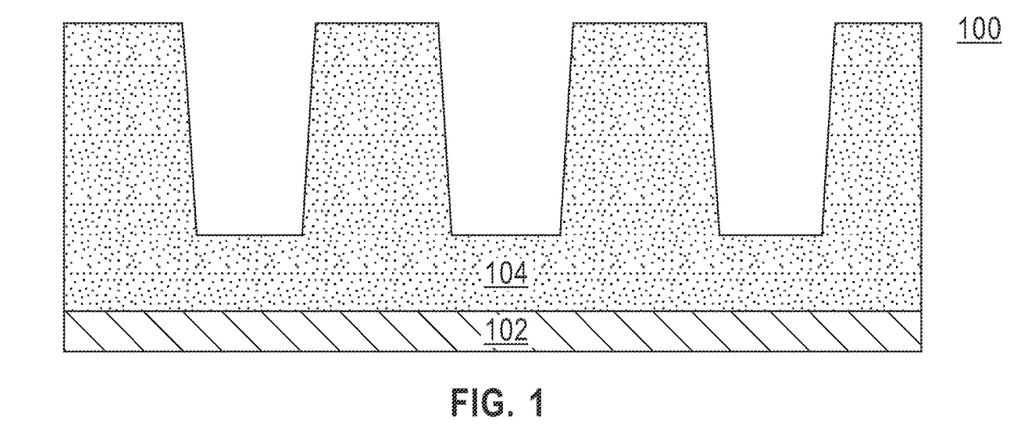
FIG. 1 depicts a cross-sectional view of the semiconductor structure after depositing a first low-k dielectric layer on top of a substrate in accordance with an embodiment of the present invention.

FIG. 1 depicts a cross-sectional view of the semiconductor structure 100 after depositing a first low-k dielectric layer 104 on top of a substrate. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, substrate 102 may be a level of interconnect wiring. For example, modern semiconductor chips may have fifteen or more levels of interconnect wiring, labeled M1-M15, so if this structure was to be used at the M2 metal level, in other words M2 metal level as substrate 102, then the M1 metal level would be located below it. A first low-k dielectric layer 104 is deposited on top of the substrate 102. In an embodiment, the first low-k dielectric layer 104 may be any insulator having a dielectric constant of less than silicon dioxide, i.e., less than about 4.0. In an alternative embodiment, the first low-k dielectric layer 104 may have a dielectric constant of less than 3.5. In an embodiment, the first low-k dielectric layer 104 may be deposited and formed using known dielectric material deposition methods. In an embodiment, the first low-k dielectric layer 104 may range from 30 nm to 120 nm but is not limited to this range. In an embodiment, the first low-k dielectric layer 104 may be SiCOH, or any other insulator known in the art. In an embodiment, the first low-k dielectric layer 104 is patterned to form dual-damascene patterning. As known to one skilled in the art, typical BEOL processes discussed herein include dual damascene, single damascene, and subtractive metal etching processes. In an embodiment, as shown in FIG. 1, three trenches are formed in the first low-k dielectric layer 104 however any number of trenches may be formed.

Figure 2:
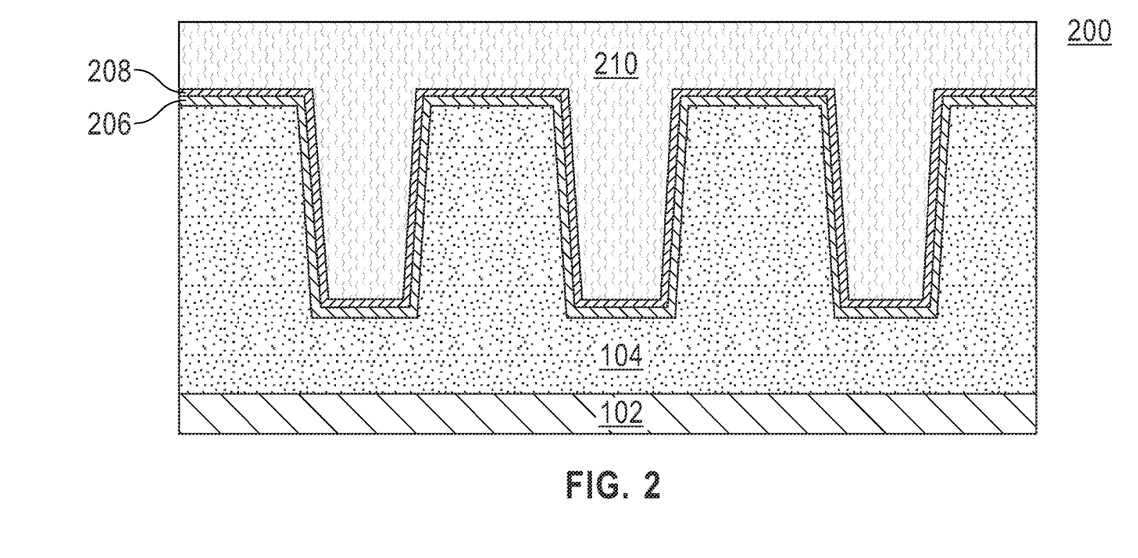
FIG. 2 depicts a cross-sectional view of the semiconductor structure after post barrier/liner/and metal fill in accordance with an embodiment of the present invention.

FIG. 2 depicts a cross-sectional view of the semiconductor structure 200 after post barrier/liner/and metal fill. As known to one skilled in the art, typical BEOL processes discussed herein include dual damascene, single damascene, and subtractive metal etching processes. Dual damascene process is most commonly used for BEOL patterning and metallization processes. A dual damascene process typically includes patterning via and trench in a dielectric material, such as an interlayer dielectric and filling the via holes and trenches with a layer of metal and planarizing the metal using a chemical mechanical (CMP) process to remove overburden or excess metal. The single damascene process includes patterning via holes in a first dielectric material, filling the via holes with a deposited metal layer, and then preforming a CMP to remove overburden or excess metal and then depositing a second dielectric material and then, performing a second etch process to form trenches, filling the trenches with metal layers and then performing a CMP to remove the overburden of metal layers. In some embodiments, a subtractive metallization process is used where a metal layer is deposited, patterned, etched, and a dielectric material is deposited over the top surface. A CMP exposes the top surface of the patterned metal. As shown in FIG. 2, a first barrier layer 206 is deposited upon the first low-k dielectric layer. In an embodiment, the first barrier layer 206 is TaN, Ta, TiN, WN, or any other material known in the art. In an embodiment, the first barrier layer 206 is deposited via sputtering, ALD, CVD, or any other process known in the art. In an embodiment, first barrier layer 206 may range from 0.5 nm to 5 nm in thickness but is not limited to this range. In an embodiment, a first liner layer 208 is deposited on top of the first barrier layer 206 via sputtering, ALD, CVD, or any other process known in the art. In an embodiment, first liner layer 208 is Ru, Co, any combination of Ru/Co, or any other material known in the art. In an embodiment, first liner layer 208 may range in thickness from 0.5 nm to 5 nm but is not limited to this range. In an embodiment, a first metal layer 210 is deposited on top of the liner layer 208. In an embodiment, the first metal layer 210 is deposited using ECP, PVD, CVD, ALD, or any other process known in the art. In an embodiment, first metal layer 210 is Cu, Ru, W, Mo, Ir, Rh or any other material known in the art.

Figure 3:
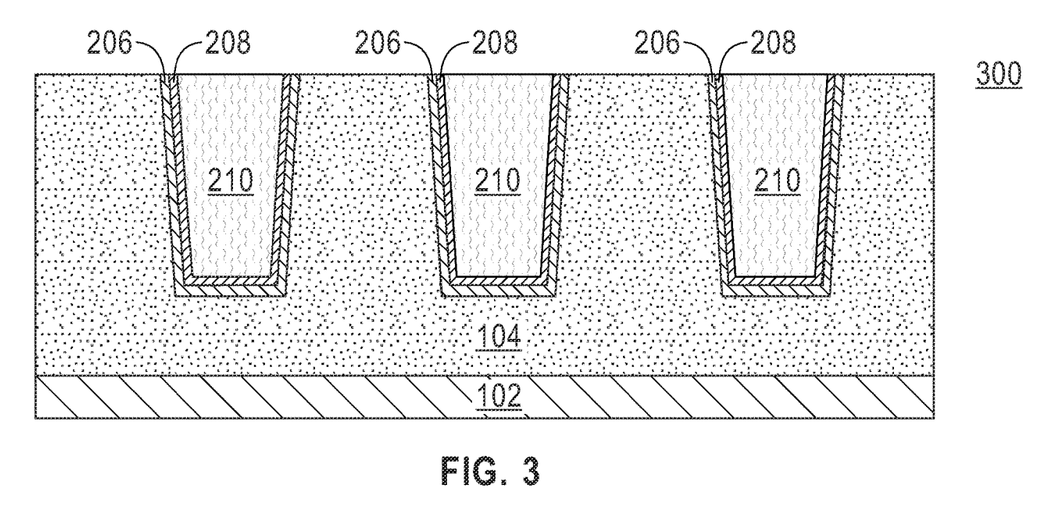
FIG. 3 depicts a cross-sectional view of the semiconductor structure after planarization in accordance with an embodiment of the present invention.

FIG. 3 depicts a cross-sectional view of the semiconductor structure 300 after planarization. After planarization, first low-k dielectric layer 104, first barrier layer 206, first liner layer 208, and first metal layer 210 are all approximately at the same height.

Figure 4:
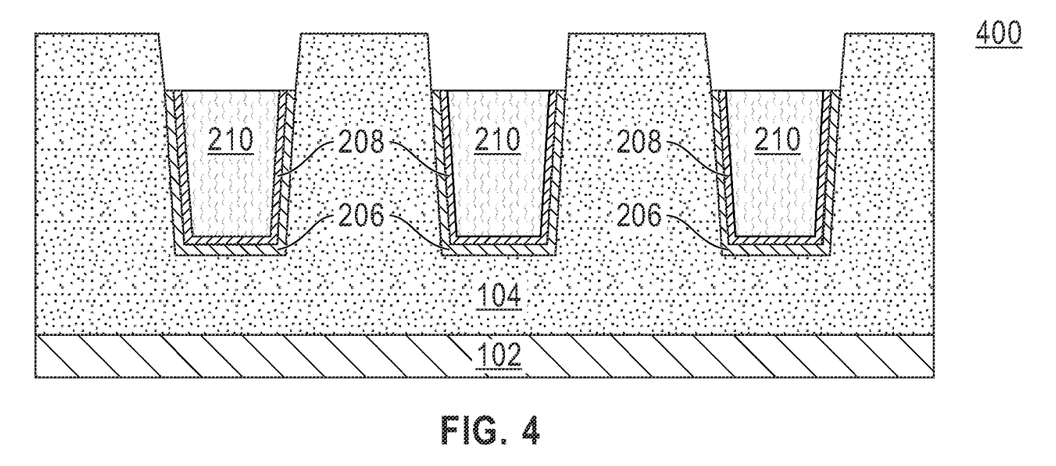
FIG. 4 depicts a cross-sectional view of the semiconductor structure after selective wet etching of the first barrier layer, first liner layer, and first metal layer in accordance with an embodiment of the present invention.

FIG. 4 depicts a cross-sectional view of the semiconductor structure 400 after selective wet etching of the first barrier layer 206, first liner layer 208, and first metal layer 210. After selective wet etching, the depth, in other words the vertical distance between the top of first low-k dielectric layer 104 and the top of first barrier layer 206, first liner layer 208, and first metal layer 210 ranges from 5 nm to 30 nm but is not limited to this range.

Figure 5:
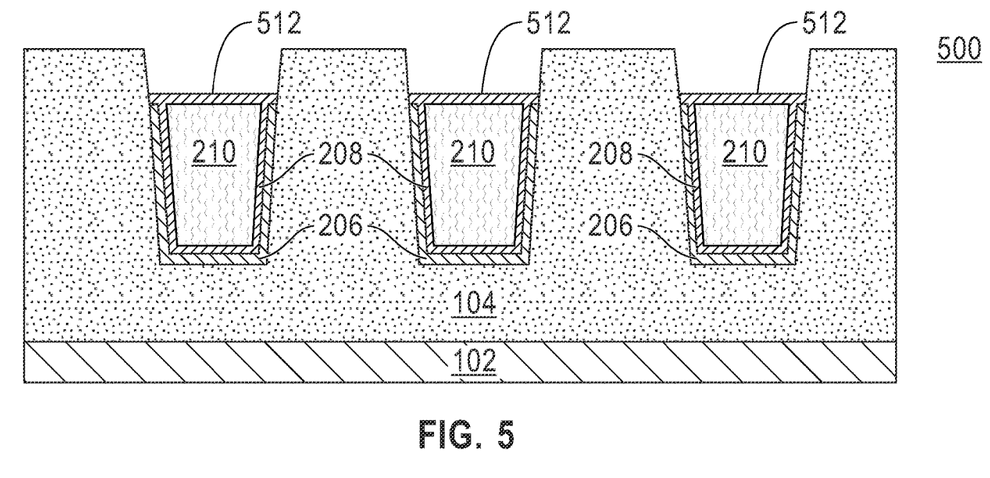
FIG. 5 depicts a cross-sectional view of the semiconductor structure after deposition of metal cap in accordance with an embodiment of the present invention.

FIG. 5 depicts a cross-sectional view of the semiconductor structure 500 after deposition of metal cap 512. It should be noted, metal cap 512 is optional, and in some embodiments, a metallic cap 512 is not deposited. A metal cap 512 is deposited on top of the first barrier layer 206, first liner layer 208, and first metal layer 210 remaining in the patterned lines. In an embodiment, metal cap 512 may be Cu, Ru, W, Mo, Ir, Rh, any combination of those materials, or any other material known in the art. In an embodiment, the metal cap 512 is deposited via area-selective deposition. In an embodiment, metal cap 512 may range in thickness from 0.5 nm to 3 nm but is not limited to this range.

Figure 6:
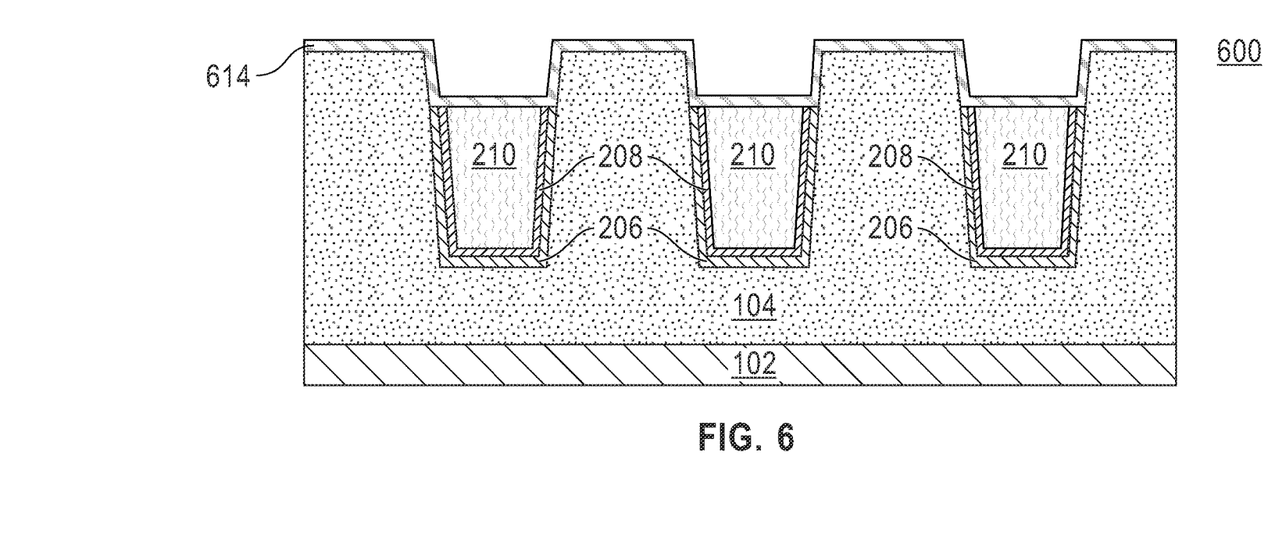
FIG. 6 depicts a cross-sectional view of the semiconductor structure after deposition of a dielectric cap in accordance with an embodiment of the present invention.

FIG. 6 depicts a cross-sectional view of the semiconductor structure 600 after deposition of a dielectric cap 614. As noted in the discussion of FIG. 5, metal cap 512 is optional, and FIG. 6 does not show metal cap 512. In the embodiment that includes metal cap 512, dielectric cap 614 is deposited upon first low-k dielectric layer 104 and metal cap 512. In the embodiment shown in FIG. 6, that does not include metal cap 512, dielectric cap 614 is deposited on top of the first low-k dielectric layer 104 and first barrier layer 206, first liner layer 208, and first metal layer 210 remaining in the patterned lines. In an embodiment, dielectric cap 614 may be AlOX, SiN, SiC, SiCN, SiNO, SiCO, any combination of those materials, or any other material known in the art. In an embodiment, dielectric cap 614 may be a multi-layer stack (e.g., bilayers, trilayers, etc.) made of the previously described materials. In an embodiment, the dielectric cap 614 is deposited using know dielectric deposition methods. In an embodiment, dielectric cap 614 may range in thickness from 0.5 nm to 3 nm but is not limited to this range.

Figure 7:
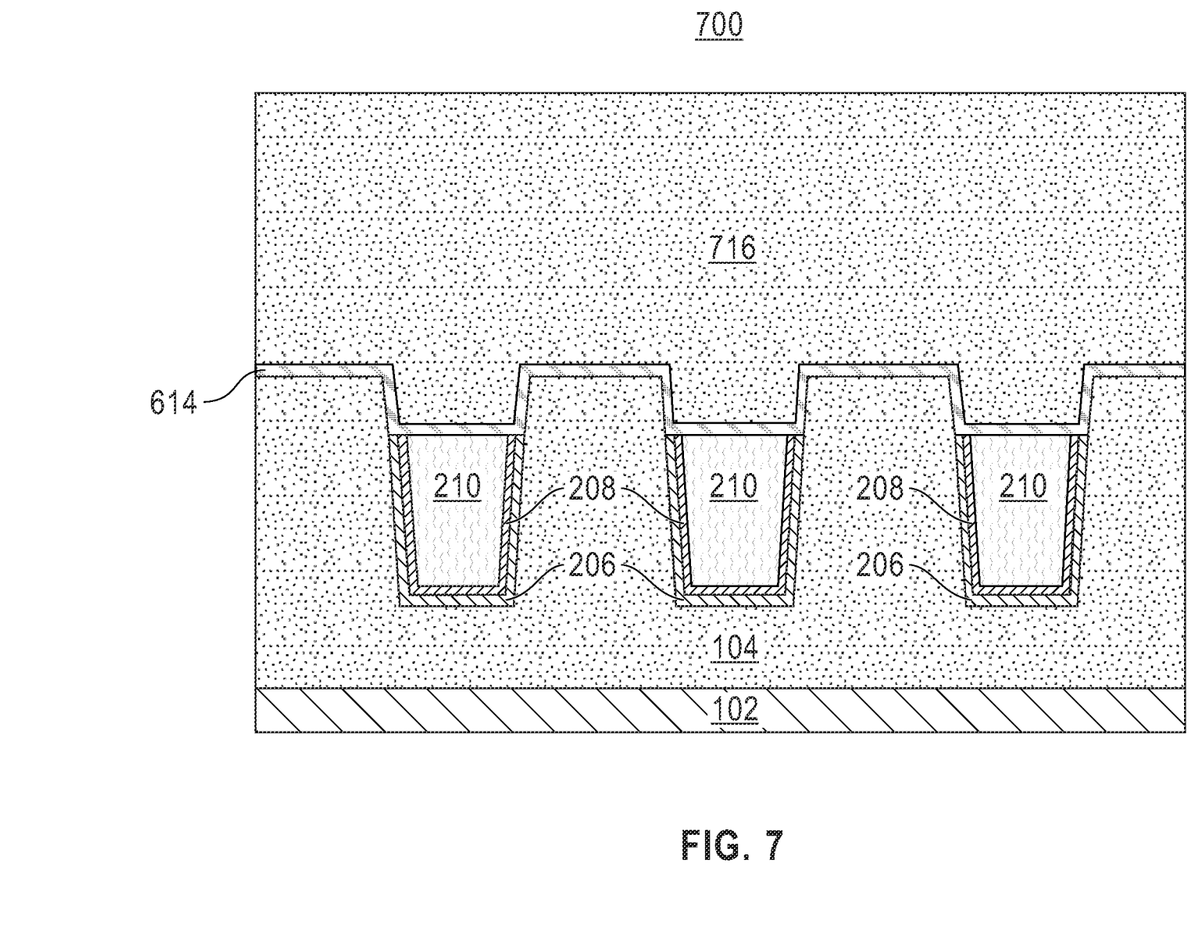
FIG. 7 depicts a cross-sectional view of the semiconductor structure after deposition of a second low-k dielectric layer in accordance with an embodiment of the present invention.

FIG. 7 depicts a cross-sectional view of the semiconductor structure 700 after deposition of a second low-k dielectric layer 716. A second low-k dielectric layer 716 is deposited on top of the dielectric cap 614. In an embodiment, the second low-k dielectric layer 716 may be any insulator having a dielectric constant of less than silicon dioxide, i.e., less than about 4.0. In an alternative embodiment, second low-k dielectric layer 716 may have a dielectric constant of less than 3.5. In an embodiment, the second low-k dielectric layer 716 may range from 30 nm to 120 nm but is not limited to this range. In an embodiment, the second low-k dielectric layer 716 may be deposited and formed using known dielectric material deposition methods.

Figure 8:
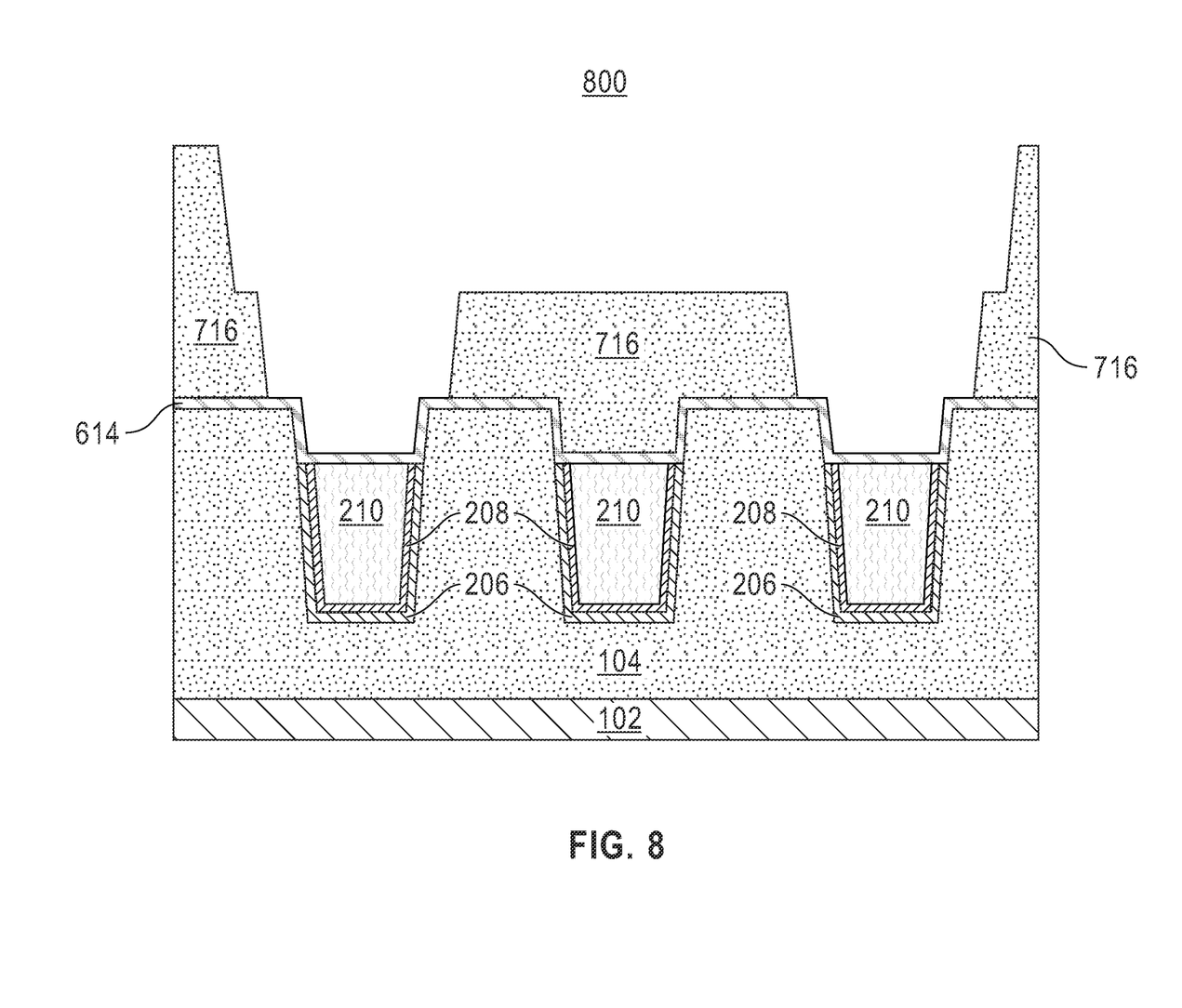
FIG. 8 depicts a cross-sectional view of the semiconductor structure after dual-damascene patterning of the second low-k dielectric layer in accordance with an embodiment.

FIG. 8 depicts a cross-sectional view of the semiconductor structure 800 after dual-damascene patterning of the second low-k dielectric layer 716. In an embodiment, the second low-k dielectric layer 716 is patterned to form dual-damascene patterning. As known to one skilled in the art, typical BEOL processes discussed herein include dual damascene, single damascene, and subtractive metal etching processes. In an embodiment, as shown in FIG. 1, two trenches are formed in the second low-k dielectric layer 716 however any number of trenches may be formed. The depth of the trenches is defined by the dielectric second low-k dielectric layer 716.

Figure 9:
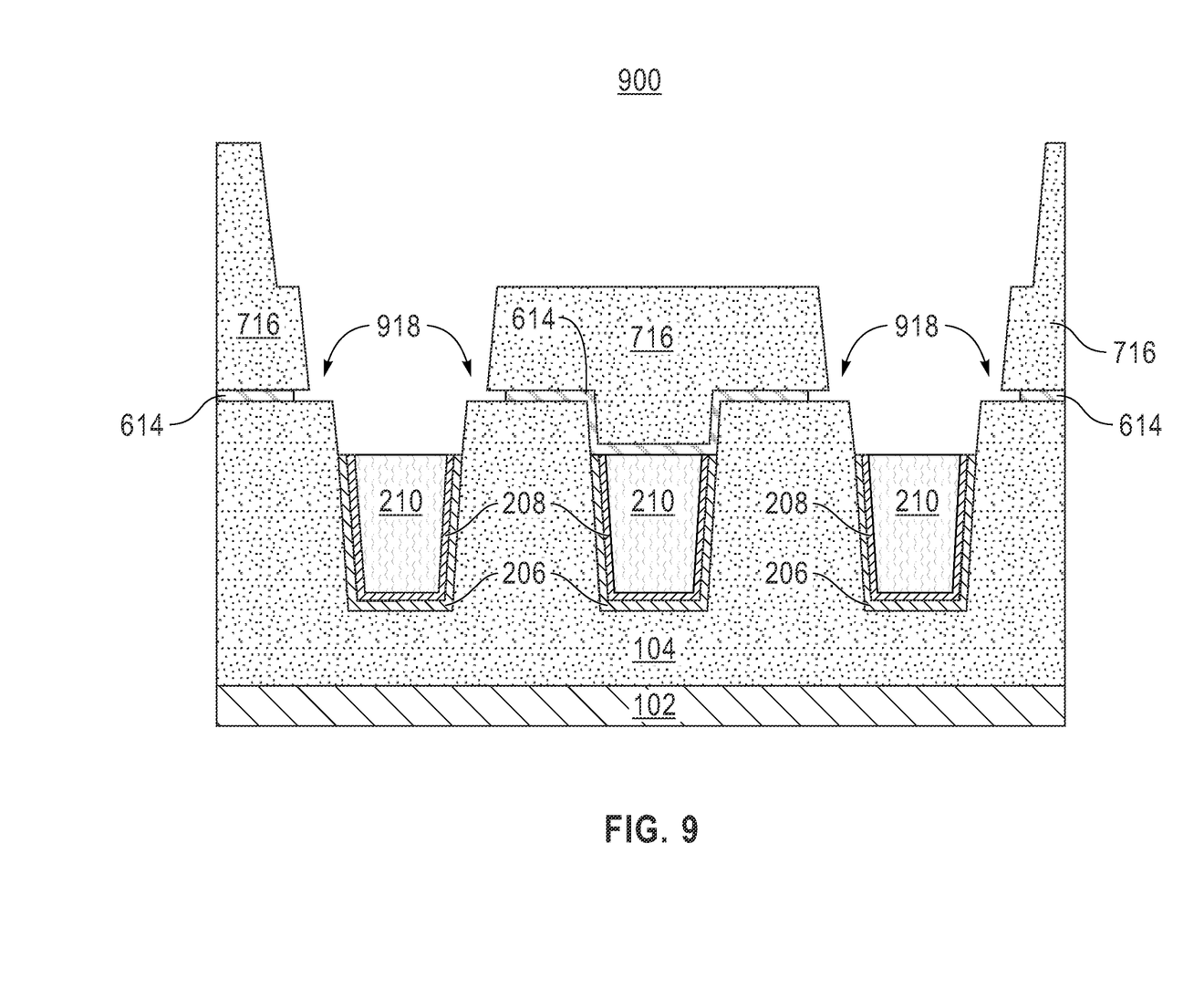
FIG. 9 depicts a cross-sectional view of the semiconductor structure after partial removal of the dielectric cap via wet etching in accordance with an embodiment of the present invention.

FIG. 9 depicts a cross-sectional view of the semiconductor structure 900 after partial removal of the dielectric cap 614 via wet etching. In an embodiment, the dielectric cap 614 exposed via the patterning of the second low-k dielectric layer 716 is removed via wet etching. In other words, the dielectric cap 614 above first barrier layer 206, first liner layer 208, and first metal layer 210 is removed via wet etching along with some of the dielectric cap 614 located between the first low-k dielectric layer 104 and the second low-k dielectric layer 716. In an embodiment, the dielectric cap 914 is removed from between 918 the first low-k dielectric layer 104 and the second low-k dielectric layer 716. In an embodiment, the dielectric cap 614 may have a removal of a range of 2 nm to 10 nm of dielectric cap 614 due to the wet etching but is not limited to that range.

Figure 10:
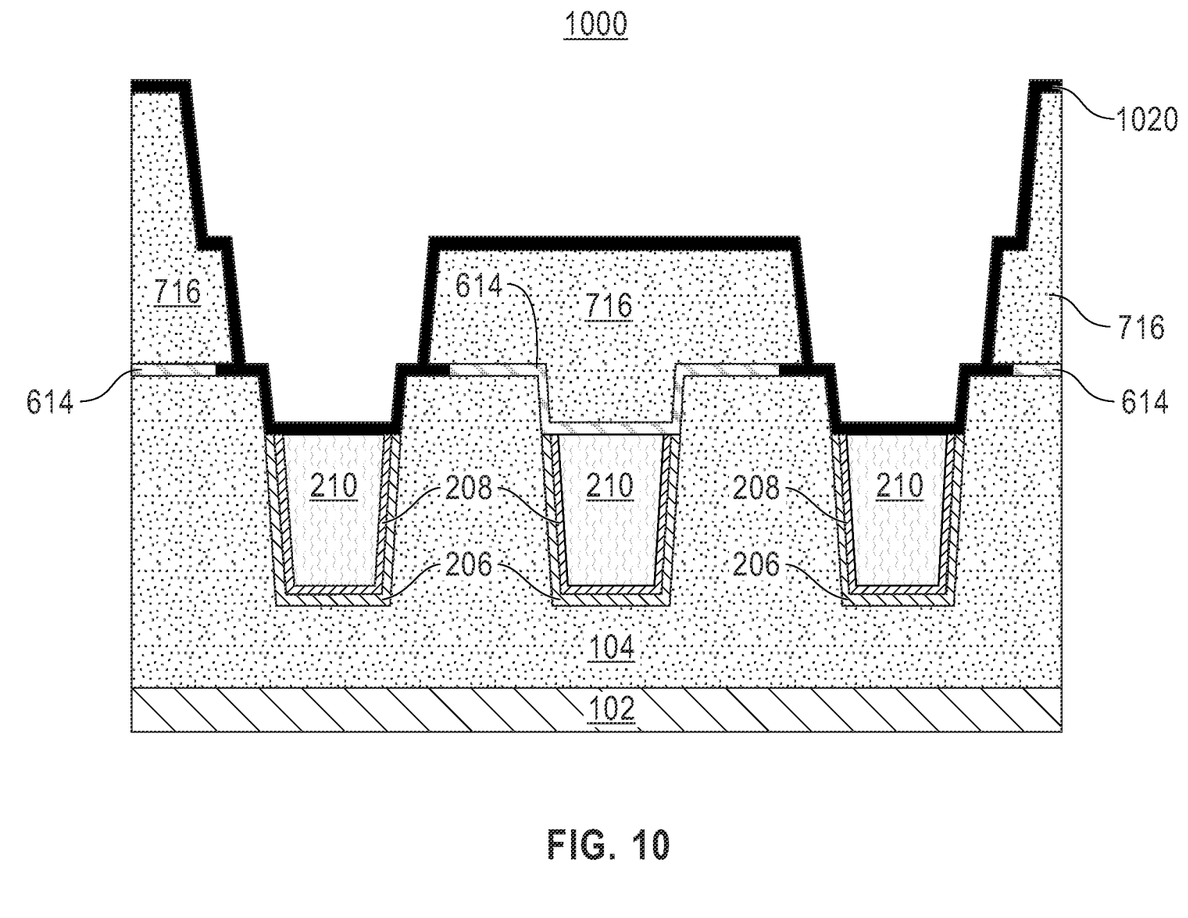
FIG. 10 depicts a cross-sectional view of the semiconductor structure after conformal deposition of a dielectric plug layer in accordance with an embodiment of the present invention.

FIG. 10 depicts a cross-sectional view of the semiconductor structure 1000 after conformal deposition of a dielectric plug layer 1020. In an embodiment, the dielectric plug layer 1020 may be $SiO_2$, $Al_2O_3$, or any other material known in the art. In an embodiment, the dielectric plug layer 1020 may be deposited using any known deposition processes known in the art, including, but not limited to, ALD. In an embodiment, dielectric plug layer 1020 may range from 2 nm to 8 nm but is not limited to that range.

Figure 11:
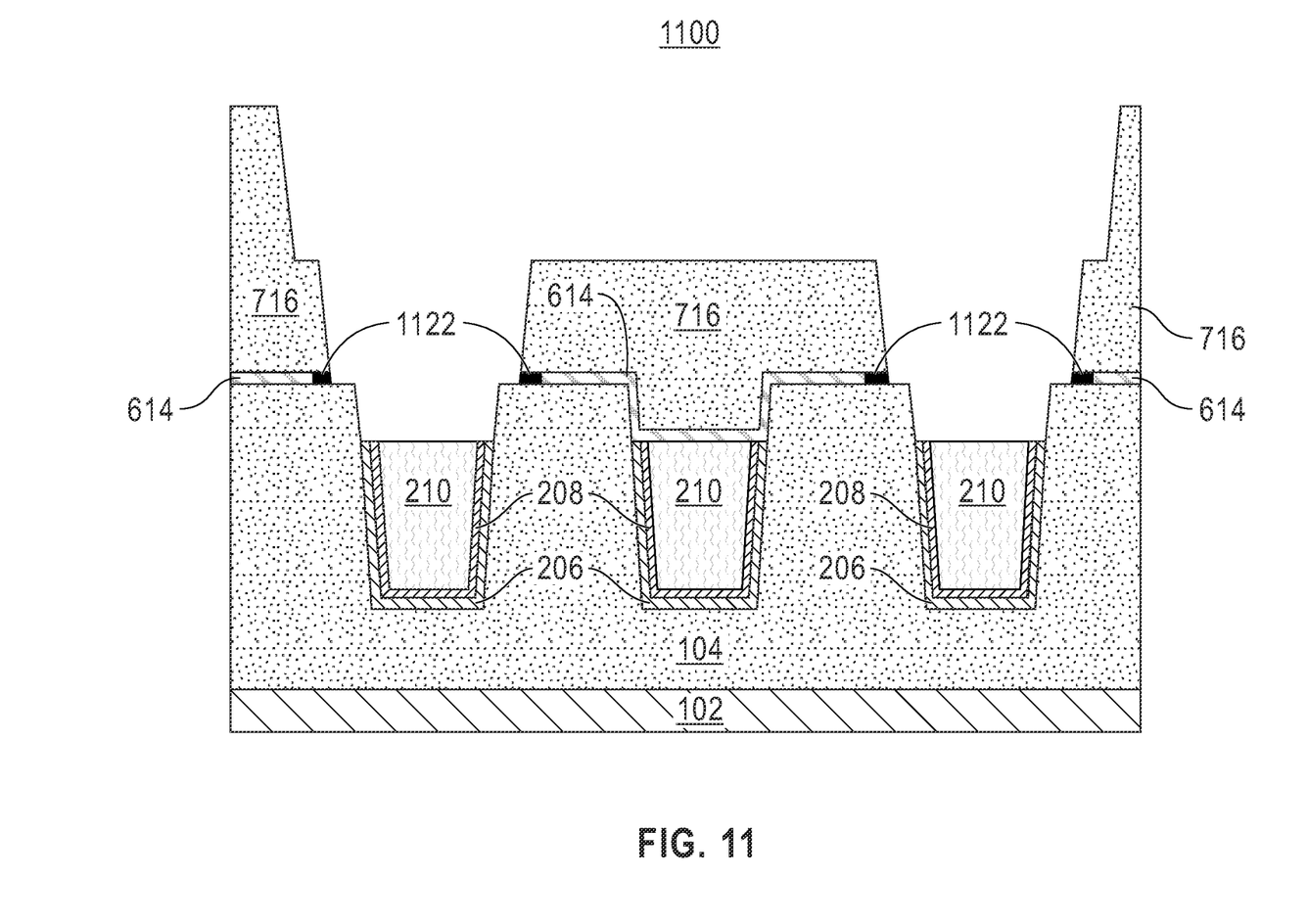
FIG. 11 depicts a cross-sectional view of the semiconductor structure 1100 after dielectric plug layer 1020 wet etching in accordance with an embodiment of the present invention.

FIG. 11 depicts a cross-sectional view of the semiconductor structure 1100 after dielectric plug layer 1020 wet etching. In an embodiment, the dielectric plug layer 1020 is partially removed via wet etching and the portion of the dielectric plug layer 1122 inside the lateral recess region between the first low-k dielectric layer 104 and second low-k dielectric layer 716 remains.

Figure 12:
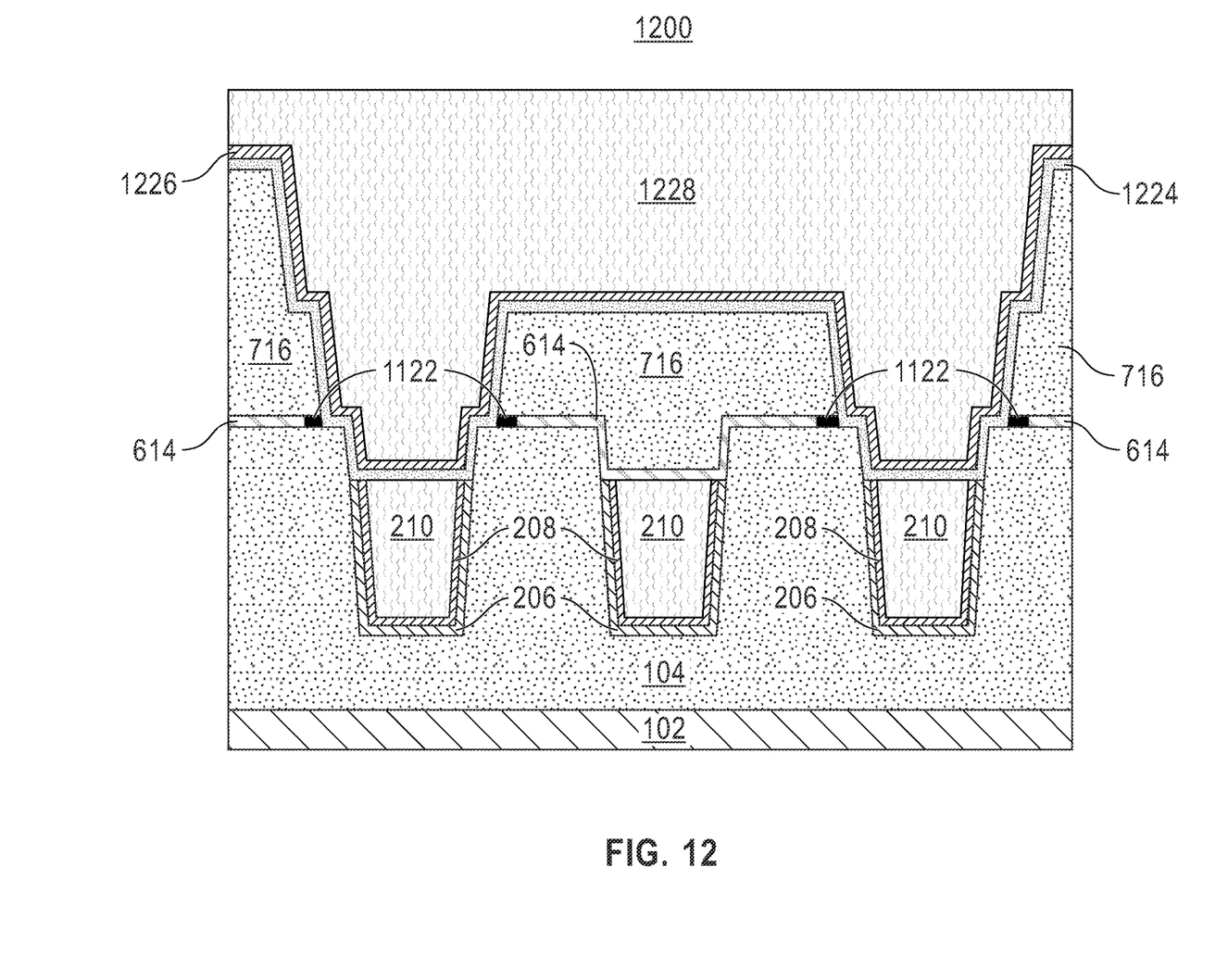
FIG. 12 depicts a cross-sectional view of the semiconductor structure 1200 after post metallization processes in accordance with an embodiment of the present invention.

FIG. 12 depicts a cross-sectional view of the semiconductor structure 1200 after post metallization processes. As shown in FIG. 12, a second barrier layer 1224 is deposited upon portions of the first barrier layer 206, first liner layer 208, first metal layer 210, first low-k dielectric layer 104, exposed portion of the dielectric plug layer 1020, and second low-k dielectric layer 716. In an embodiment, the second barrier layer 1224 is TaN, Ta, TiN, WN, or any other material known in the art. In an embodiment, the second barrier layer 1224 is deposited via sputtering, ALD, CVD, or any other process known in the art. In an embodiment, second barrier layer 1224 may range from 0.5 nm to 5 nm in thickness but is not limited to this range. In an embodiment, second liner layer 1226 is deposited on top of the second barrier layer 1224 via sputtering, ALD, CVD, or any other process known in the art. In an embodiment, second liner layer 1226 is Ru, Co, any combination of Ru/Co, or any other material known in the art. In an embodiment, second liner layer 1226 may range in thickness from 0.5 nm to 5 nm but is not limited to this range. In an embodiment, a second metal layer 1228 is deposited on top of the second liner layer 1226. In an embodiment, the second metal layer 1228 is deposited using ECP, PVD, CVD, ALD, or any other process known in the art. In an embodiment, the second metal layer 1228 is Cu, Ru, W, Mo, Ir, Rh or any other material known in the art.

Figure 13:
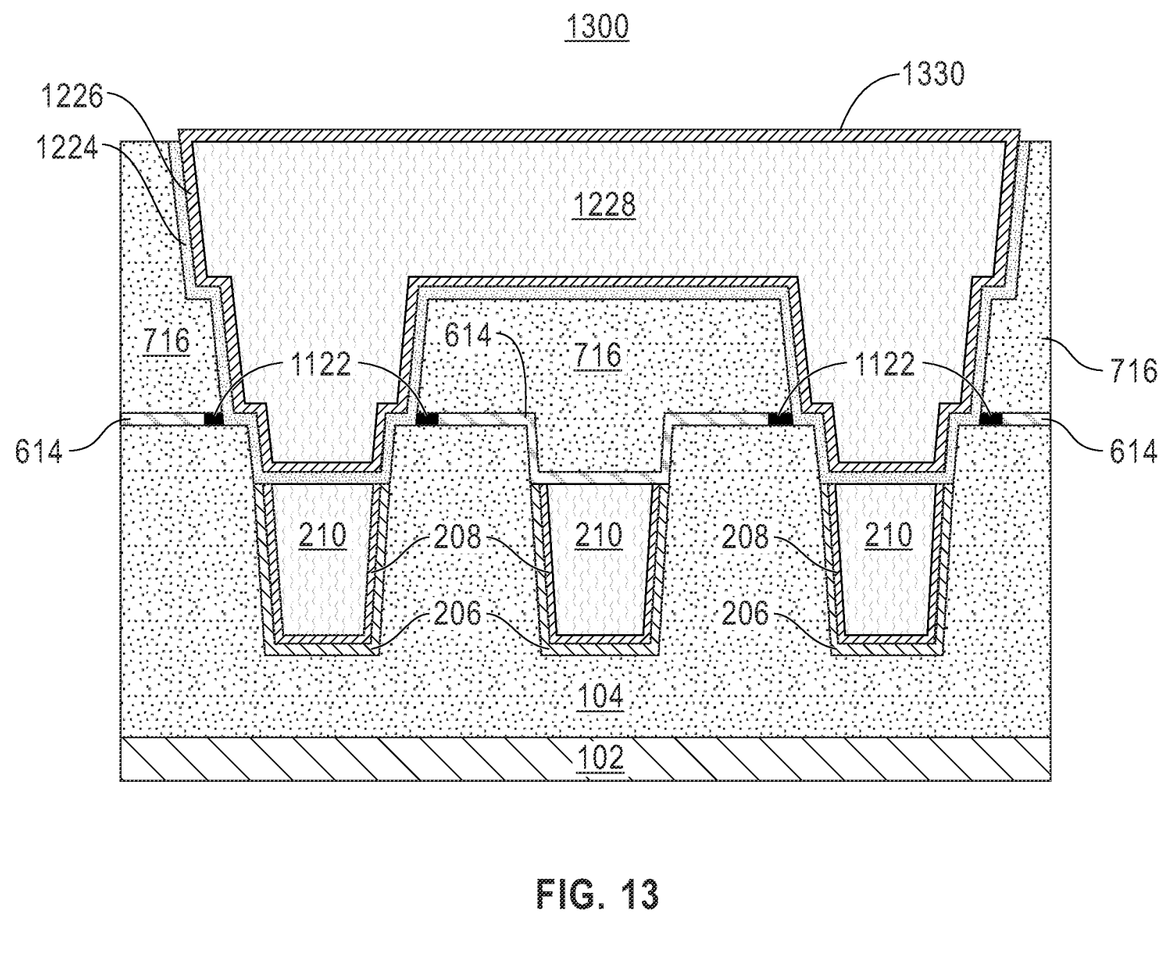
FIG. 13 depicts a cross-sectional view of the semiconductor structure 1300 after planarization in accordance with an embodiment of the present invention.

FIG. 13 depicts a cross-sectional view of the semiconductor structure 1300 after planarization. After planarization, second low-k dielectric layer 716, second barrier layer 1224, second liner layer 1226, and second metal layer 1228 are all approximately at the same height. After planarization, a second metal cap 1330 is deposited on top of the second liner layer 1226 and second metal layer 1228 remaining in the patterned lines. In an embodiment, second metal cap 1330 may be Cu, Ru, W, Mo, Ir, Rh, any combination of those materials, or any other material known in the art. In an embodiment, the second metal cap 1330 is deposited via area-selective deposition. In an embodiment, the second metal cap 1330 may range in thickness from 0.5 nm to 5 nm but is not limited to this range.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A method of forming a dual-damascene fully-aligned via (FAV), the method comprising:
   forming a first low-k dielectric layer on a substrate;
   forming a second low-k dielectric layer above the first low-k dielectric layer;
   forming a dielectric cap between portions of the first and second low-k dielectric layers;
   forming a trench within the first and second low-k dielectric layers;
   forming a laterally recessed region in the dielectric cap located between the first and second low-k dielectric layers, wherein the laterally recessed region extends in a lateral direction between the dielectric cap and trench sidewalls of the trench; and
   forming a dielectric plug within the laterally recessed region in the dielectric cap wherein the dielectric plug extends in the lateral direction between the dielectric cap and the trench sidewalls of the trench.

2. The method of claim 1, wherein the dielectric plug extends at least 2 nm laterally between the dielectric cap and the trench sidewalls of the trench.

3. The method of claim 1, wherein the dielectric plug extends less than 10 nm laterally between the dielectric cap and the trench sidewalls of the trench.

4. The method of claim 1, wherein the dielectric plug is formed from a material selected from the group consisting of $SiO_2$ and $Al_2O_3$.

5. The method of claim 1, further comprising:
   forming a barrier layer on the trench sidewalls of the trench;
   forming a liner layer on top of the barrier layer; and
   forming a metal layer on top of the liner layer, the metal layer filling the trench.

6. A dual-damascene fully-aligned via (FAV) structure, the structure comprising:

a laterally recessed region in a dielectric cap located between a first low-k dielectric layer and a second low-k dielectric layer, the laterally recessed region extending in a lateral direction between the dielectric cap and trench sidewalls of a trench formed within the first and second low-k dielectric layers; and a dielectric plug formed within the laterally recessed region in the dielectric cap located between the first and second low-k dielectric layers, the dielectric plug extending in the lateral direction between the dielectric cap and the trench sidewalls of the trench.

7. The structure of claim 6, wherein the dielectric plug is formed from a material selected from the group consisting of $SiO_2$ and $Al_2O_3$.

8. The structure of claim 6, wherein the dielectric plug is at least 2 nm in length laterally between the dielectric cap and the trench sidewalls of the trench.

9. A dual-damascene fully-aligned via (FAV) structure, the structure comprising:
a first low-k dielectric layer on top of a substrate;
a second low-k dielectric layer above the first low-k dielectric layer;
a dielectric cap formed between portions of the first and second low-k dielectric layers;
a trench formed within the first and second low-k dielectric layers;
a barrier layer formed along bottom and sidewall surfaces of the trench; and
a dielectric plug extending in a lateral direction between the dielectric cap formed between the portions of the first and second low-k dielectric layers and the barrier layer formed along the sidewall surfaces of the trench.

10. The structure of claim 9, further comprising:
a liner layer formed on top of the barrier layer; and
a metal layer formed on top of the liner layer and filling the trench.

11. The structure of claim 9, wherein the dielectric plug is formed from a material selected from the group consisting of $SiO_2$ and $Al_2O_3$.

12. The structure of claim 9, wherein the dielectric plug is at least 2 nm in length laterally between the dielectric cap and the barrier layer formed along the sidewall surfaces of the trench.

13. The structure of claim 9, wherein the dielectric plug is less than 10 nm in length laterally between the dielectric cap and the barrier layer formed along the sidewall surfaces of the trench.

* * * * *